(12) United States Patent
Tsuwako et al.

(10) Patent No.: US 6,822,823 B1
(45) Date of Patent: Nov. 23, 2004

(54) HARD DISK DRIVE WITH ELECTRICALLY CONDUCTIVE SHEET FOR ELECTROSTATIC DISCHARGE PROTECTION

(75) Inventors: Kazushi Tsuwako, Machida; Kenichi Kuramoto, Fujisawa; Hiroshi Matsuda, Zama; Hiroki Kitahori, Fujisawa, all of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/553,182

(22) Filed: Apr. 20, 2000

(30) Foreign Application Priority Data

Apr. 27, 1999 (JP) ............................................. 11-119530

(51) Int. Cl.$^7$ ............................................. G11B 17/00
(52) U.S. Cl. ................................................... 360/97.01
(58) Field of Search ........................... 360/97.01, 97.02, 360/97.03, 98.01

(56) References Cited

U.S. PATENT DOCUMENTS

| | | | | |
|---|---|---|---|---|
| 4,811,152 A | * | 3/1989 | Kishine et al. ............. | 360/133 |
| 4,896,001 A | * | 1/1990 | Pitts et al. ............. | 174/35 MS |
| 5,149,048 A | * | 9/1992 | Morehouse et al. ........ | 248/632 |
| 5,276,577 A | * | 1/1994 | Brooks et al. ........... | 360/97.02 |
| 5,436,803 A | * | 7/1995 | Annis et al. ................ | 361/818 |
| 5,557,064 A | * | 9/1996 | Isern-Flecha et al. .. | 174/35 MS |
| 5,587,854 A | * | 12/1996 | Sato et al. ................ | 360/97.01 |
| 5,597,979 A | * | 1/1997 | Courtney et al. ......... | 174/35 R |
| 5,654,847 A | | 8/1997 | Yagi et al. | |
| 5,732,464 A | | 3/1998 | Lamont | |
| 5,758,401 A | * | 6/1998 | Nelson ........................ | 29/428 |
| 5,781,373 A | * | 7/1998 | Larson et al. ............ | 360/97.02 |
| 6,266,207 B1 | * | 7/2001 | Iwahara et al. .......... | 360/97.02 |
| 6,324,054 B1 | * | 11/2001 | Chee et al. ................. | 248/635 |

FOREIGN PATENT DOCUMENTS

| | | |
|---|---|---|
| EP | 843 512 A2 | 5/1998 |
| JP | 61-37195 | 3/1986 |
| JP | 63-173758 | 11/1988 |
| JP | 02-144196 | 12/1990 |
| JP | 06-236674 | 8/1994 |
| JP | 06-68198 | 9/1994 |
| JP | 07-202466 | 8/1995 |
| JP | 07-287917 | 10/1995 |
| JP | 2000-163947 | 6/2000 |

* cited by examiner

*Primary Examiner*—David Hudspeth
*Assistant Examiner*—Angel Castro
(74) *Attorney, Agent, or Firm*—Robert B. Martin; Bracewell & Patterson, L.L.P.

(57) ABSTRACT

A hard disk drive has an enclosure with disk construction members and is characterized by covering the enclosure with an electrically conductive sheet. The electrically conductive sheet protects the drive regardless of which direction an ESD charge is applied. The electrically conductive sheet does not permit ESD to pass through the disk construction members stored in the enclosure. Therefore, it is possible to form a structure in which a GMR head or the like in an enclosure is not damaged due to ESD even if the enclosure is handled by a general end user. Moreover, the present invention relates to an electrically conductive sheet for covering at least both principal planes of the enclosure of a hard disk drive constituted as described above. Other modes of the invention include at least both principal planes of an enclosure being covered by the electrically conductive sheet in such a way that both sheets on both principal planes are electrically connected. In addition, portions where the enclosure contacts the disk construction members on both principal planes may also be covered and electrically interconnected. Furthermore, the electrically conductive sheet may be bonded to the surface of the enclosure by an adhesive, or provided with an opening at a position corresponding to an enclosure portion that must be brought into contact with an external atmosphere.

12 Claims, 3 Drawing Sheets

[Figure 1]
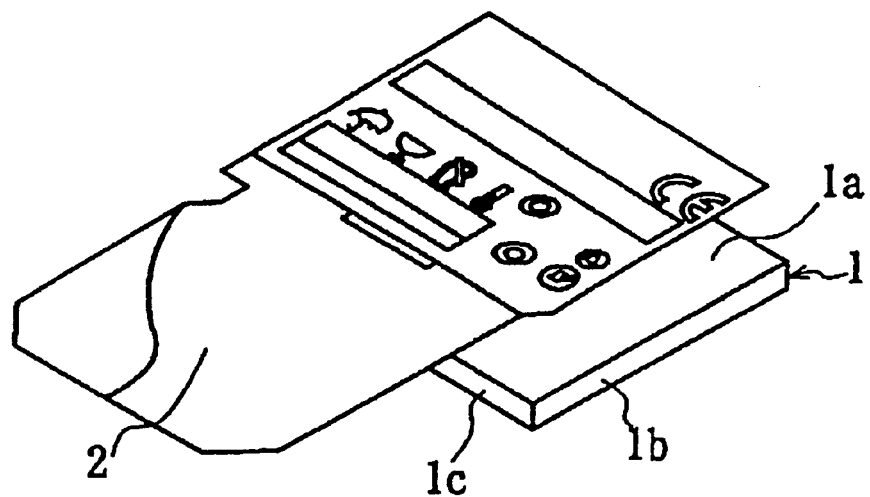
[Figure 2]
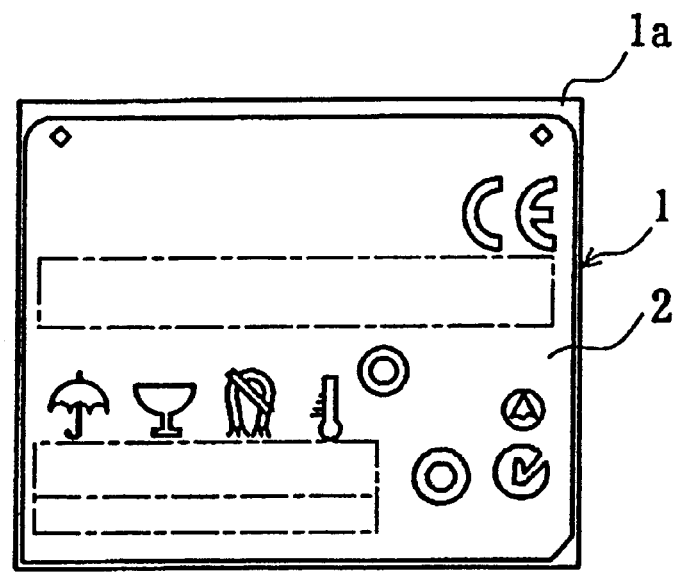

[Figure 3]
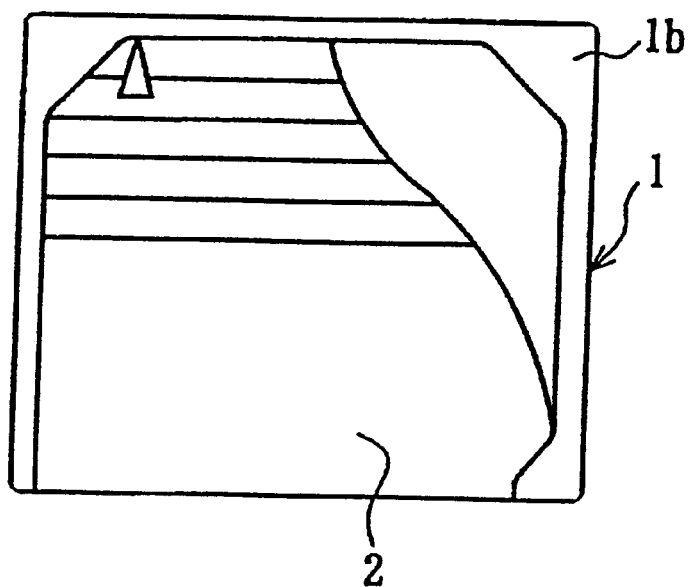

[Figure 4]
(a)
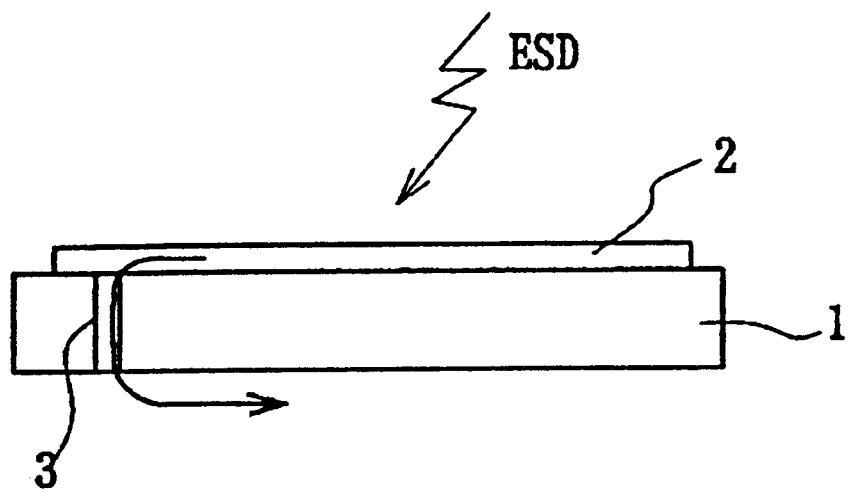
(b)
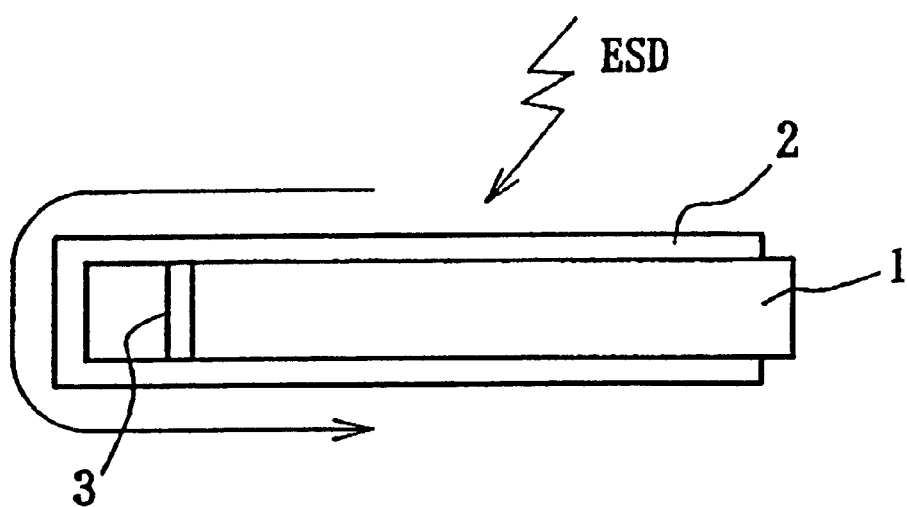

HARD DISK DRIVE WITH ELECTRICALLY CONDUCTIVE SHEET FOR ELECTROSTATIC DISCHARGE PROTECTION

BACKGROUND OF THE INVENTION

1. Technical Field

The present invention relates to a hard disk drive configured by storing disk construction members such as a disk and a head in its enclosure and an electric conductor sheet used for the hard disk drive.

2. Description of the Related Art

Hard disk drives having various configurations have been configured for storing disk construction members such as a disk and a head in its enclosure. In recent years, the number of hard disk drives using a GMR (giant magneto resistive) head has increased in order to achieve higher recording densities and to reduce the size of the drive. Since GMR heads are relatively vulnerable to electrostatic discharge (hereafter referred to as ESD), additional precautions are necessary to minimize the risk of damage to the hard disk drive.

Conventional hard disk drives having GMR heads are commonly used in PCs, but they are not readily accessible to the end user. Therefore, it is sufficient to only consider the user's operation of the hard disk drive when manufacturing the PC. That is, a conventional hard disk drive is configured by storing disk construction members in an enclosure composed of a top cover with the electronic card-side exposed. Although the electronic card-side of the hard disk drive is typically not handled by the operator, the top cover side is touched by the operator and is exposed to potential ESD damage. Therefore, precautions should be taken to protect the drive from ESD. Moreover, further ESD protective measures should be taken for drives hitherto known because only operating them by specific operators having the knowledge of ESD is considered.

SUMMARY OF THE INVENTION

A hard disk drive has an enclosure with disk construction members and is characterized by covering the enclosure with an electrically conductive sheet. The electrically conductive sheet protects the drive regardless of which direction an ESD charge is applied. The electrically conductive sheet does not permit ESD to pass through the disk construction members stored in the enclosure. Therefore, it is possible to form a structure in which a GMR head or the like in an enclosure is not damaged due to ESD even if the enclosure is handled by a general end user. Moreover, the present invention relates to an electrically conductive sheet for covering at least both principal planes of the enclosure of a hard disk drive constituted as described above.

Preferable modes of the invention include at least both principal planes of an enclosure being covered by the electrically conductive sheet in such a way that both sheets on both principal planes are electrically connected. In addition, portions where the enclosure contacts the disk construction members on both principal planes may also be covered and electrically interconnected. Furthermore, the electrically conductive sheet may be bonded to the surface of the enclosure by an adhesive, or provided with an opening at a position corresponding to an enclosure portion that must be brought into contact with an external atmosphere.

The present invention is made to solve the problems of the prior art and its object is to provide a hard disk drive not damaged due to ESD even if the drive is operated by a general end user. The above as well as objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 is a perspective view of a hard disk drive constructed in accordance with the invention, showing the drive during a stage of assembly;

FIG. 2 is a plan view of the drive of FIG. 1 showing an upper plane of the drive;

FIG. 3 is a plan view of the drive of FIG. 1 showing a lower plane of the drive;

FIG. 4(a) is a side view of a drive showing the flow of ESD when a metallic seal is provided for only one principal plane; and FIG. 4(b) is a side view of the drive of FIG. 1 showing the flow of ESD when a metallic seal is provided for both principal planes.

DETAILED DESCRIPTION OF ILLUSTRATIVE EMBODIMENT

FIGS. 1, 2, and 3 show the configuration of a hard disk drive of the present invention. In FIGS. 1, 2, and 3, symbol 1 denotes an enclosure for storing disk construction members (not illustrated) such as a magnetic disk and a GMR head and 2 denotes a metallic seal serving as an electric conductor sheet. In this case, FIG. 1 is an illustration showing a state in which a hard disk drive of the present invention is manufactured and FIGS. 2 and 3 are illustrations showing the upper plane and the lower plane of a hard disk drive of the present invention.

A hard disk drive of the present invention is characterized by covering an enclosure 1 with a metallic seal 2. That is, in the case of the example shown in FIGS. 1 to 3, a hard disk drive of the present invention is configured by preparing one metallic seal 2 capable of covering both principal planes of the enclosure 1. Almost the entire upper plane 1a, lower plane 1b, and side plane 1c are covered as shown in FIG. 1. An adhesive is applied to the entire surface facing the upper plane 1a, lower plane 1b, and side plane 1c of the enclosure 1 of the metallic seal 2, and the metallic seal 2 is bonded to the enclosure 1 so as to cover the upper plane 1a, lower plane 1b, and side plane 1c of the enclosure 1.

The hard disk drive is constituted so as to respectively cover both principal planes, that is, the upper plane 1a and lower plane 1b of the enclosure 1 with the metallic seal 2. Moreover, the metallic seals 2 on the principal planes are electrically connected each other by covering the side plane 1c between the upper plane 1a and the lower plane 1b with one metallic seal 2. Furthermore, as shown in FIGS. 1 to 3, the metallic seal 2 is applied to almost the entire surface of both s principal planes, and portions where the enclosure 1 contacts disk construction members on both principal planes of the enclosure 1. The metallic seal 2 covers the drive even when a GMR head is moved on the disk, such that the spindle portion serves as the rotation center of a disk and the pivot portion serves as the moving center.

It is preferable to cover at least the portions where the enclosure 1 contacts disk construction members on both principal planes of the enclosure 1 with the metallic seal 2. It is more preferable to cover almost the whole of both principal planes with the metallic seal 2 for the following reasons. First, when the metallic seal 2 is provided for only one principal plane (as shown in FIG. 4(a)), even if ESD is applied to the metallic seal 2, for example, ESD passes through spindle 3 from the metallic seal 2 and propagates to a plane provided with no metallic seal as shown by the arrow. This configuration permits a GMR head stored in the enclosure 1 to be damaged by the ESD. However, when one metallic seal 2 is provided for both principal planes and the side plane as shown in FIG. 4(b), even if ESD is applied to the metallic seal 2 at the upper plane, ESD propagates from the metallic seal 2 at the upper plane to the metallic seal 2 at the lower plane through the metallic seal at the side plane to protect GMR heads and the like stored in the enclosure 1 from ESD damage.

In the preferred embodiment, an aluminum seal made of an aluminum foil is used as the metallic seal 2 among members constituting a hard disk drive of the present invention. Moreover, any adhesive can be used as the adhesive for bonding the metallic seal 2 to the enclosure 1 as long as it can fix the seal 2 and the enclosure 1. However, it is preferable to use an acrylic-based adhesive such as PAT-1® made by Lintec Corporation. Furthermore, as shown in FIGS. 1 to 3, it is possible to add characters and symbols showing a product name or the like on the surface of the metallic seal 2. In this case, it is impossible to directly print characters or symbols on the surface of the metallic seal 2. However, by forming a layer such as an adhesive layer on the surface of the metallic seal 2, it is possible to print characters and symbols on the surface of the adhesive layer. Moreover, though the example shown in FIGS. 1 to 3 shows the metallic seal 2 having no opening, it is possible to form an opening at the position of the metallic seal 2 corresponding to a portion of the enclosure 1 which must be directly brought into contact with an external atmosphere such as the hole of a breather filter.

In the case of the above hard disk drive of the present invention, the metallic seal 2 is insulated because it is only bonded to the enclosure 1 by an adhesive. It is permitted that the surface of the metallic seal 2 is made of a conductor or insulator. Moreover, the areas of the upper plane 1a and the lower plane 1b of the enclosure 1 of the hard disk drive are almost covered with the metallic seal 2. In this case, because most points weak in ESD present on the enclosure 1 of the hard disk drive including the above spindle and pivot are covered with the metallic seal 2, they are protected from ESD. It is found through an ESD test that most ESD is absorbed by the metallic seal 2. Though the aluminum seal used for the hard disk drive of the present invention has a thickness of approximately 40µm including the insulating layer, the potential applied to the hard disk drive covered with an aluminum seal is 500 V or lower to a discharge of 10 kV. This is the same value as the case of protecting the hard disk drive with a conventionally-used ESD bag and shows that a voltage applied to the hard disk drive can be lowered.

The hard disk drive of the present invention provides the metallic seal 2 for the enclosure 1 as shown in FIGS. 1 to 3 and the hard disk drive of a comparative example provided with no metallic seal 2 were prepared and an ESD test was performed for the prepared hard disk drives of the present invention and the comparative example in accordance with IEC61000-4 which is the European test standard for obtaining a CE mark. As a result, it is found that the hard disk drive of the comparative example cannot pass the test at ESD 8,000 V or cannot obtain the CE mark but the hard disk drive of the present invention can pass the test even at ESD 25,000 V and obtain the CE mark.

As described above, according to the present invention, because the enclosure of a hard disk drive is covered with an electric conductor sheet, ESD is absorbed by the electric conductor sheet even if ESD comes from any direction and thereby, ESD does not pass through disk construction members stored in the enclosure. Therefore, it is possible to realize a structure not damaged due to ESD even if the structure is handled by a general end user.

It will be understood by those skilled in the art that various changes in form and detail may be made to the invention without departing from the spirit and scope of the invention.

What is claimed is:

1. A hard disk drive comprising an enclosure with two principal planes, a pair of side planes, and disk construction members, wherein both principal planes and one of the side planes of the enclosure are almost entirely covered with an electric conductor sheet, and the other of the side planes is uncovered by the electric conductor sheet.

2. The hard disk drive according to claim 1 wherein the electric conductor sheet on both principal planes and said one of the side planes are electrically connected.

3. The hard disk drive according to claim 1 wherein at least portions of the enclosure and the disk construction members contact each other on both principal planes of the enclosure and are respectively covered with the electric conductor sheet, and wherein the electric conductor sheets on both principal planes are electrically connected.

4. The hard disk drive according to claim 2 wherein both principal planes and said one of the side planes are covered with one electric conductor sheet.

5. The hard disk drive according to claim 3 wherein both principal planes and said one of the side planes are covered with one electric conductor sheet.

6. The hard disk drive according to claim 1 wherein the electric conductor sheet is bonded to a surface of the enclosure by an adhesive.

7. The hard disk drive according to claim 1 wherein the electric conductor sheet has a discontinuity.

8. The hard disk drive according to claim 1 wherein the electric conductor sheet has a discontinuity on said other of the side planes.

9. A bard disk drive, comprising:
    an enclosure having an upper plane, a lower plane, and a side plane;
    a data storage media located within the enclosure, wherein the data storage media in unexposed to an atex or of the enclosure;
    an electric conductor seal covering almost entirely covering the upper plane, the lower plane, and the side plane; and
    an adhesive located between the seal and the enclosure.

10. The hard disk drive of claim 9 wherein the electric conductor seal on the upper plane, the lower plane, and the side plane are electrically connected.

11. The hard disk drive of claim 9 wherein the electric conductor seal has a discontinuity.

12. The hard disk drive of claim 11 wherein the enclosure has another side plane and wherein the discontinuity is located on said another side plane.

* * * * *

UNITED STATES PATENT AND TRADEMARK OFFICE
CERTIFICATE OF CORRECTION

PATENT NO. : 6,822,823 B1
DATED : November 23, 2004
INVENTOR(S) : Tsuwako et al.

It is certified that error appears in the above-identified patent and that said Letters Patent is hereby corrected as shown below:

Column 4,
Line 48, please replace "bard" with -- hard --.

Signed and Sealed this

Twenty-fifth Day of October, 2005

JON W. DUDAS
*Director of the United States Patent and Trademark Office*